(12) United States Patent
Nagayama

(10) Patent No.: US 7,042,163 B2
(45) Date of Patent: May 9, 2006

(54) ORGANIC ELECTROLUMINESCENCE DISPLAY AND METHOD OF FABRICATING THE SAME

(75) Inventor: Kenichi Nagayama, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 195 days.

(21) Appl. No.: 10/655,584

(22) Filed: Sep. 5, 2003

(65) Prior Publication Data

US 2004/0119399 A1 Jun. 24, 2004

(30) Foreign Application Priority Data

Sep. 12, 2002 (JP) ........................................ 2002-266449

(51) Int. Cl.
*G09G 3/10* (2006.01)

(52) U.S. Cl. ............................... 315/169.3; 315/169.1; 313/503; 345/36; 257/642; 257/607

(58) Field of Classification Search .............. 315/169.3, 315/169.1; 313/503, 509; 445/24, 25; 345/36, 345/45, 76; 257/40, 607, 642
See application file for complete search history.

(56) References Cited

U.S. PATENT DOCUMENTS

| 5,355,235 | A | | 10/1994 | Nishizawa et al. ............ 359/59 |
|---|---|---|---|---|
| 6,277,679 | B1 | * | 8/2001 | Ohtani ........................ 438/151 |
| 6,812,637 | B1 | * | 11/2004 | Cok et al. .................... 313/503 |
| 6,853,001 | B1 | * | 2/2005 | Ohtani ........................ 257/72 |
| 2002/0047581 | A1 | | 4/2002 | Koyama .................. 315/169.3 |
| 2002/0128515 | A1 | | 9/2002 | Ishida et al. ................ 564/435 |
| 2003/0047736 | A1 | * | 3/2003 | Hayashi et al. ................ 257/79 |
| 2003/0075733 | A1 | * | 4/2003 | Yamazaki et al. ........... 257/200 |
| 2004/0201018 | A1 | * | 10/2004 | Yamahara et al. ............. 257/59 |

FOREIGN PATENT DOCUMENTS

| JP | 11-109890 | 4/1999 |
|---|---|---|
| JP | 2000-133464 | 5/2000 |

* cited by examiner

*Primary Examiner*—Haissa Philogene
(74) *Attorney, Agent, or Firm*—Drinker Biddle & Reath LLP

(57) ABSTRACT

An organic electroluminescence display includes a substrate and a plurality of light emitting parts formed on the substrate, each of the light emitting parts including an organic electroluminescence device and an organic thin film transistor connected to the organic electroluminescence device. The organic electroluminescence device has a pair of opposed electrodes and an organic material layer including an organic light-emitting layer laminated between the pair of electrodes. The organic thin film transistor has a source electrode and a drain electrode opposed to each other, an organic semiconductor film laminated so as to form a channel between the source electrode and the drain electrode, and a gate electrode for applying a field to the organic semiconductor film between the source electrode and the drain electrode. In the organic electroluminescence device, each of the light emitting parts further includes a source-drain insulating film for avoiding a short circuit between the source electrode and the drain electrode, a protective insulating film for protecting the organic semiconductor film, and a pixel insulating film for covering an edge of either one of the electrodes of the organic electroluminescence device. At least two out of the source-drain insulating film, the protective insulating film, and the pixel insulating film are made of the same dielectric material.

8 Claims, 7 Drawing Sheets

ORGANIC ELECTROLUMINESCENCE DISPLAY AND METHOD OF FABRICATING THE SAME

BACKGROUND OF THE INVENTION

1. Field of the Invention

The present invention relates to an organic electroluminescence display having a display array or a regular arrangement of a plurality of light emitting parts which consist of organic electroluminescence devices each having a light-emitting layer made of a thin film of organic electroluminescence material utilizing electroluminescence (hereinafter, also referred to as EL) of organic compound material in which luminescence is produced by electron or hole injection.

2. Description of the Related Art

An organic EL display, comprising a plurality of organic EL devices arranged in a matrix, is receiving attention as a display that is low in power consumption, high in display quality, and capable of low-profile configuration.

The organic EL device is known as a self-luminescence device in which at least one organic material layer and a metal electrode are laminated on a transparent substrate. An example of the transparent substrate is a glass plate provided with a transparent electrode of indium-tin oxide, i.e., so-called ITO. Examples of the organic material layer include an organic electron-transporting layer, an organic light-emitting layer, and an organic hole-transporting layer. Positive and negative voltages are respectively applied to the transparent electrode and the metal electrode, i.e., anode and cathode, for charge accumulation. When a barrier voltage i.e., a luminescence threshold voltage inherent to the device is exceeded, a current starts to flow and there occurs luminescence with certain intensity approximately proportional to this direct current.

Among display panels that use organic EL devices are a simple matrix type display panel in which the organic EL devices are simply arranged in a matrix, and an active matrix type display panel in which the organic EL devices arranged in a matrix are provided with an additional transistor-based driving element each. When compared to the simple matrix type display panel, the active matrix type display panel has such advantages as low power consumption and low inter-pixel crosstalk. The active matrix type display is suited to large-screen display and high-definition display in particular.

The display of active matrix drive system exercises switching with respect to each of the light emitting parts by using thin film transistors (TFTs) which are made of polysilicon, for example. Consequently, a current is supplied pixel by pixel to cause luminescence of the organic EL devices. MOS-FETs (Metal Oxide Semiconductor Field Effect Transistors) are used as the TFTs.

A MOS-FET has two reverse conductive regions of polysilicon which are formed on a glass substrate, for example. An oxide ($SiO_2$) thin film and a metal gate electrode are formed in succession on the surface of the substrate, between the reverse conductive regions, so that the conductivity is controlled by the field applied from the metal gate electrode. Since the display substrate must be a polysilicon substrate or the like which requires a high temperature treatment, and films of inorganic material such as Si must be formed thereon, the fabrication involves high temperature process.

Displays having large-screen display panels are in high demand. There has been developed a low-temperature polysilicon substrate thereof. Despite the name "low-temperature," however, the substrate requires a heat treatment on the order of 500° C. at the time of fabrication. Anyway, incorporating inorganic material TFTs into the large-screen display panel of an organic EL display of active matrix drive system inevitably pushes up the cost of the display.

Then, there has been proposed an organic TFT that has an organic semiconductor film of organic material formed between a pair of opposite electrodes. It is considered that this organic TFT can be used to drive organic EL devices.

Nevertheless, there has not been proposed any concrete organic TFT structure. Moreover, an organic semiconductor material and an organic material layer, structurally indispensable to the organic EL devices to be driven by the organic TFT, are both extremely poor in heat resistance, solvent resistance, moisture resistance, and so on. It has thus been difficult to achieve a practical organic EL display panel.

SUMMARY OF THE INVENTION

In view of the foregoing, it is one of the objects of the present invention to provide an organic EL display in which organic thin film transistors and organic EL devices capable of fabrication at relatively low temperatures are formed on a common substrate.

An organic EL display according to the present invention comprises a substrate and a plurality of light emitting parts formed on the substrate, each of the light emitting parts including an organic EL device and an organic thin film transistor connected to the organic EL device. The organic EL device has a pair of opposed electrodes and an organic material layer including an organic light-emitting layer laminated between the pair of electrodes. The organic thin film transistor has a source electrode and a drain electrode opposed to each other, an organic semiconductor film laminated so as to form a channel between the source electrode and the drain electrode, and a gate electrode for applying a field to the organic semiconductor film between the source electrode and the drain electrode. Each of the light emitting parts further includes a source-drain insulating film for avoiding a short circuit between the source electrode and the drain electrode, a protective insulating film for protecting the organic semiconductor film, and a pixel insulating film for covering an edge of either one of the electrodes of the organic EL device. At least two out of the source-drain insulating film, the protective insulating film, and the pixel insulating film are made of the same dielectric material.

A method of fabricating an organic EL display according to the present invention is one for fabricating an organic EL display comprising a substrate and a plurality of light emitting parts formed on the substrate, each of the light emitting parts including an organic EL device and an organic thin film transistor connected to the organic EL device. The method comprises: a step of forming organic thin film transistors each having a source electrode and a drain electrode opposed to each other, an organic semiconductor film laminated so as to form a channel between the source electrode and the drain electrode, and a gate electrode for applying a field to the organic semiconductor film between the source electrode and the drain electrode; a step of forming the organic EL devices each having a pair of opposed electrodes and an organic material layer including an organic light-emitting layer laminated between the pair of electrodes; and an insulating film forming step of forming, in each of the light emitting parts, a source-drain insulating film for avoiding a short circuit between the source electrode and the drain electrode, a protective insulating film for protecting the organic semiconductor film, and a pixel insulating film for covering an edge of either one of the electrodes of the organic EL device. At least two out of the source-drain insulating film, the protective insulating film, and the pixel insulating film are made of the same dielectric material, the two being formed in an identical step.

DETAILED DESCRIPTION OF THE INVENTION

Hereinafter, embodiments of the present invention will be described with reference to the drawings.

Figure 1:
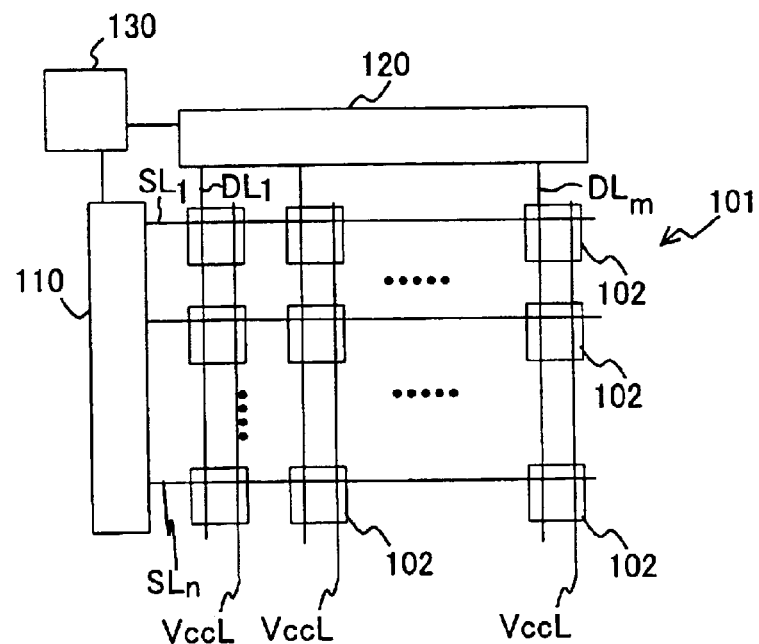
FIG. 1 is a block diagram showing the configuration of the display panel of an organic EL display according to an embodiment of the present invention.

FIG. 1 shows an organic EL display of active matrix drive system according to an embodiment. The display has a display panel 101, an address driver 110, a data driver 120, and a controller 130.

As shown in FIG. 1, the display panel 101 comprises "n" (n is an integer) scan lines SL1 to SLn which are formed in parallel at predetermined intervals, and "m" (m is an integer) data lines DL1 to DLm which are formed in parallel at predetermined intervals. The scan lines and the data lines are laid so that they cross each other at predetermined intervals with right angles therebetween. The display panel 101 also comprises n x m light emitting parts 102 which are formed at portions corresponding to the respective intersections of the scan lines and the data lines. Each scan line is connected to the address driver 110 at one end. Each data line is connected to the data driver 120 at one end.

The address driver 110 applies a voltage to the scan lines SL1-SLn one by one in succession.

The data driver 120 applies a data voltage for causing luminescence of the light emitting parts 102 to the data lines DL1–DLm.

The controller 130 is connected with the address driver 110 and the data driver 120, and controls the operation of the address driver 110 and the data driver 120 according to image data supplied in advance.

Figure 2:
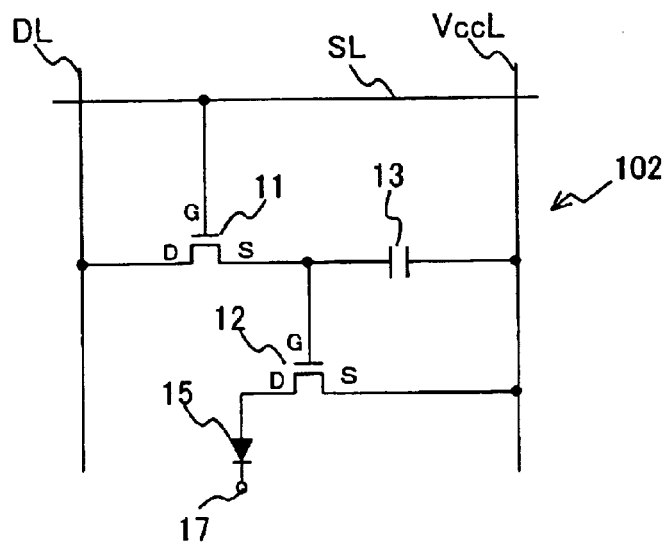
FIG. 2 is a circuit diagram showing a light emitting part of the organic EL display according to the embodiment of the present invention.

As shown in FIG. 2, each of the light emitting parts 102 comprises an address organic TFT 11, a drive organic TFT 12, a capacitor 13, and an organic EL device 15. The address organic TFT 11 is a transistor for selection, and the drive organic TFT 12 a transistor for driving.

In FIG. 2, the gate electrode G of the address organic TFT 11 is connected with the scan line SL to which an address signal is supplied. The drain electrode D of the address organic TFT 11 is connected with the data line DL to which a data signal is supplied. The source electrode S of the address organic TFT 11 is connected to the gate electrode G of the drive organic TFT 12 and one of the terminals of the capacitor 13. The source electrode S of the drive organic TFT 12 is connected to a power supply line VccL along with the other terminal of the capacitor 13. The drain electrode D of the drive organic TFT 12 is connected to the anode of the organic EL device 15. The cathode of the organic EL device 15 is connected to a common electrode 17.

The power supply line VccL shown in FIG. 2 and the common electrode 17 in connection with the cathode of each organic EL device 15 are connected to a voltage source (not shown) for supplying power thereto.

Description will now be given of the luminescence control operation of this circuit. Initially, in FIG. 2, an ON voltage is supplied to the gate electrode G of the address organic TFT 11. Then, the address organic TFT 11 passes a current from the source electrode S to the drain electrode D, the current corresponding to the voltage of the data supplied to the source electrode S. When the gate electrode G of the address organic TFT 11 is supplied with an OFF voltage, the address organic TFT 11 reaches a so-called cutoff in which the drain electrode D of the address organic TFT 11 enters an open state. Consequently, while the gate electrode G of the address organic TFT 11 is at the ON voltage, the capacitor 13 is charged and the voltage is supplied to the gate electrode G of the drive organic TFT 12. The drive organic TFT 12 then passes a current based on the gate voltage and the source voltage, from the source electrode S to the drain electrode D. This makes the organic EL device 15 produce luminescence. When the gate electrode G of the address organic TFT 11 is at the OFF voltage, the address organic TFT 11 enters an open state. The drive organic TFT 12 retains the voltage of the gate electrode G because of the charge stored in the capacitor 13, thus maintaining the driving current until the next scan. The luminescence of the organic EL device 15 is also maintained.

Figure 3:
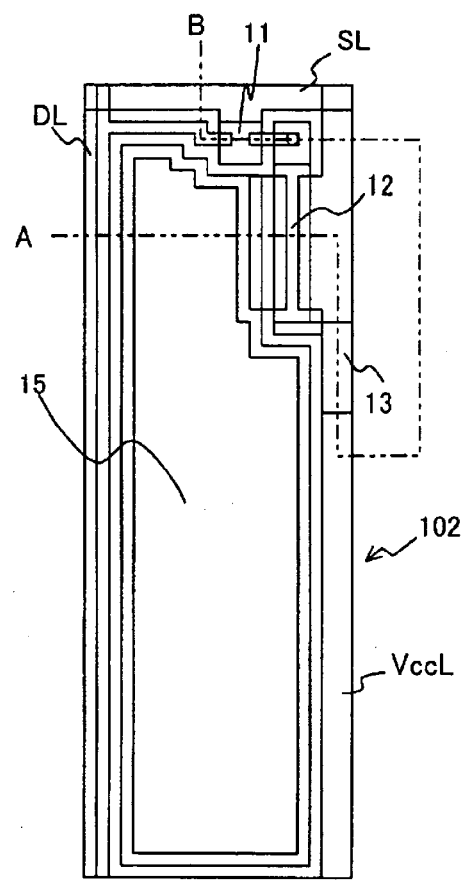
FIG. 3 is a plan view of the light emitting part of the organic EL display according to the embodiment of the present invention, as seen from the display side.
Figure 4:
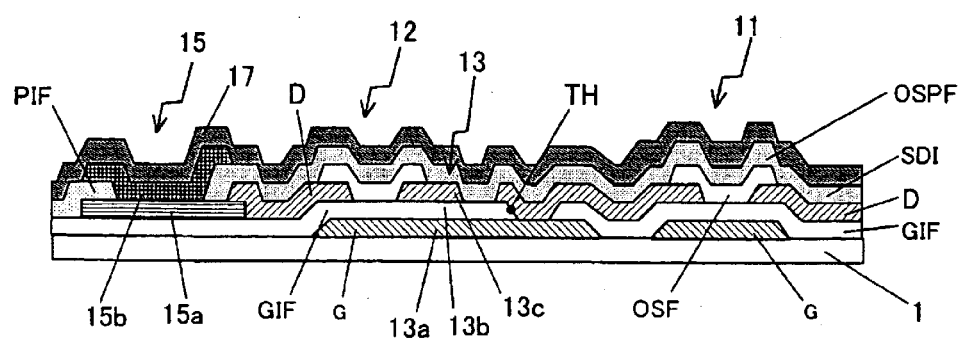
FIG. 4 is a sectional view taken along the line A-B of FIG. 3.

FIGS. 3 and 4 shows the structure of the organic EL display panel that comprises organic EL devices to be driven by the organic TFTs of the present invention. As shown in the plan view of FIG. 3, each single light emitting part of the organic EL display panel contains an organic EL device 15, a plurality of organic TFTs necessary for driving the organic EL device 15, such as an address organic TFT 11 and a drive organic TFT 12, and a capacitor 13 necessary for retaining the data voltage. This configuration can be arranged near the intersections of the scan lines SL, data lines DL, and power supply lines VccL to achieve the light emitting parts of respective pixels. FIG. 4 shows a section taken along the line A-B of FIG. 3.

Figure 5:
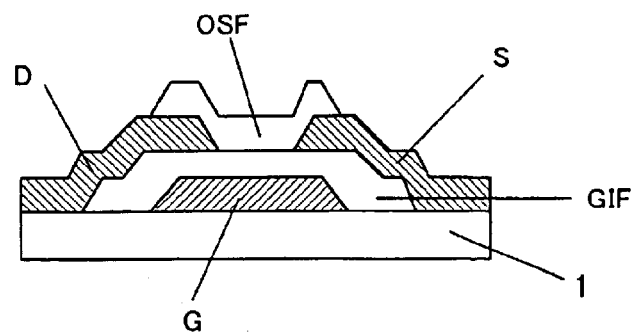
FIG. 5 is a sectional view of an organic thin film transistor in the light emitting part of the organic EL display according to the embodiment of the present invention.

FIG. 5 shows the structure of the address organic TFT 11 and the drive organic TFT 12. As shown in FIG. 5, an organic TFT includes a source electrode S, a drain electrode D, an organic semiconductor film OSF, a gate electrode G, and a gate insulating film GIF. The source electrode S and the drain electrode D are opposed to each other. The organic semiconductor film OSF is made of an organic semiconductor laminated so as to form a channel between the source and drain electrodes. The gate electrode G applies an electric field to the organic semiconductor film OSF between the source electrode S and the drain electrode D. The gate insulating film GIF insulates the gate electrode G from the source electrode S and the drain electrode D.

As shown in FIG. 4, the gate insulating film GIF is formed so as to cover at least the gate electrode G and the transistor portions. The gate insulating film GIF has a through hole TH which is necessary for establishing wiring between the transistors. Films of the same dielectric material may be formed simultaneously so that they function as the gate insulating film GIF and the dielectric of the capacitor 13. Thus, as shown in FIG. 4, the gate insulating film GIF and the dielectric of the capacitor 13 are formed continuously.

As shown in FIG. 4, a source-drain insulating film SDI is formed all over the source electrode S and the drain electrode D. This aims to avoid a short circuit with the common electrode 17 of the organic EL device. The source-drain insulating film SDI also covers the organic semiconductor film OSF, thereby functioning as an organic semiconductor protective insulating film OSPF of the organic semiconductor film. The source-drain insulating film SDI further covers edges of a pixel electrode 15a of the organic EL device 15, thereby functioning as a pixel insulating film PIF.

The drive organic TFT 12 is connected to the pixel electrode 15a. An organic material layer 15b of the organic EL device typically has a thickness as extremely small as on the order of 0.1 μm. The edges of the pixel electrode 15a are thus prone to a short circuit with the common electrode 17. This is desirably avoided by the provision of the pixel insulating film PIF which covers the edges of the pixel electrode 15a.

The organic EL device 15 comprises the pixel electrode 15a, the organic material layer 15b, and the common electrode 17. The organic material layer 15b typically consists of a plurality of layers including a hole injecting layer, a hole-transporting layer, a light-emitting layer, an electron-transporting layer, and an electron injecting layer; nevertheless, what is indispensable is the light-emitting layer alone. The organic material layer 15b is colored pixel by pixel depending on the luminescent color. Excepting the light-emitting layer, those layers common to different colors, if any, may be formed over the entire surface as if the common electrode 17 is, instead of being formed pixel by pixel.

At least either one of the pixel electrode 15a and the common electrode 17 must have light transmittance in order to output the EL emission to exterior.

Figure 6:
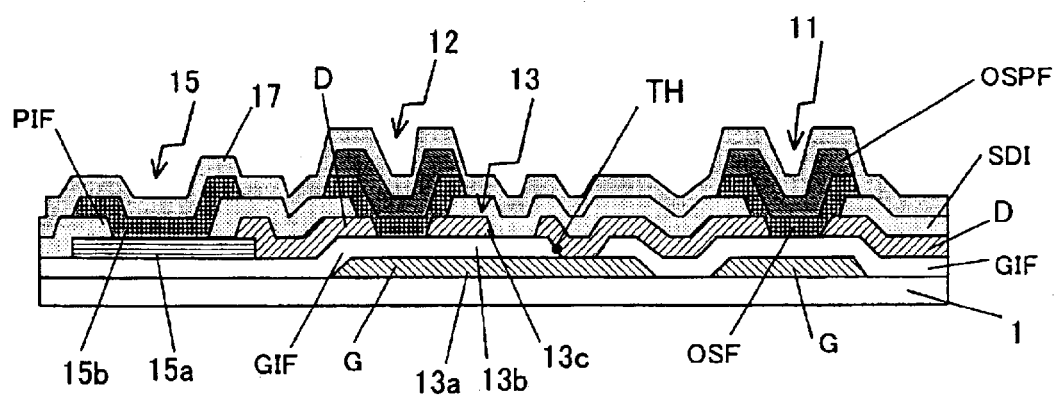
FIG. 6 is a sectional view showing the light emitting part of the display panel of the organic EL display according to another embodiment of the present invention.

Among the three insulating films for use in the organic EL display of the present invention, i.e., the source-drain insulating film SDI, the pixel insulating film PIF, and the organic semiconductor protective insulating film OSPF, any two or more films may be formed simultaneously. In the structure of FIG. 4, the source-drain insulating film SDI, the pixel insulating film PIF, and the organic semiconductor protective insulating film OSPF, three are formed at the same time. Here, it is also possible to form two of the insulating films simultaneously. FIG. 6 shows a structure for the case where the source-drain insulating film SDI and the pixel insulating film PIF are formed simultaneously. The formation of the organic semiconductor film OSF follows the simultaneous formation of the source-drain insulating film SDI and the pixel insulating film PIF. After the formation of the organic semiconductor film OSF, the organic semiconductor protective insulating film OSPF is formed.

The foregoing example has dealt with two-transistor configuration which is the simplest to drive an organic EL device. The present invention may also be applied, however, to devices using three or more transistors.

Figure 7:
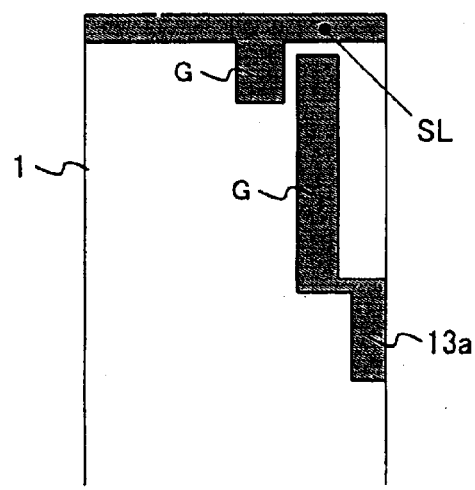
FIGS. 7 to 14 are schematic enlarged partial plan views each showing a substrate in the step of fabricating the display panel of the organic EL display according to the embodiment of the present invention.

Hereinafter, the method of fabricating an organic EL display according to the present invention will be described.
Formation of Gate Electrodes As shown in FIG. 7, a bottom wiring pattern including a scan line SL and gate electrodes G is initially formed on a substrate 1 which is made of glass, plastic, or the like. This forms the gate electrode G of the address organic TFT to be connected with the scan line SL, the gate electrode G of the drive organic TFT to be connected with the power supply line, and an area for making one electrode 13a of the capacitor. The capacitor electrode 13a is arranged at a position directly below the power supply line to be connected with later. Arranging the capacitor directly below the power supply line allows a larger pixel area.

The scan line SL and the gate electrodes are preferably made of low resistivity material, typically a pure metal or an alloy. The available materials include Al, Ag, Cu, Au, Cr, and alloys containing the same. Any method, including sputtering, EB (electron beam) evaporation, resistance heating evaporation, CVD (chemical vapor deposition), and printing may effect the film formation. The pattern formation may also use any method, such as photoetching, printing, and mask evaporation.

Figure 8:
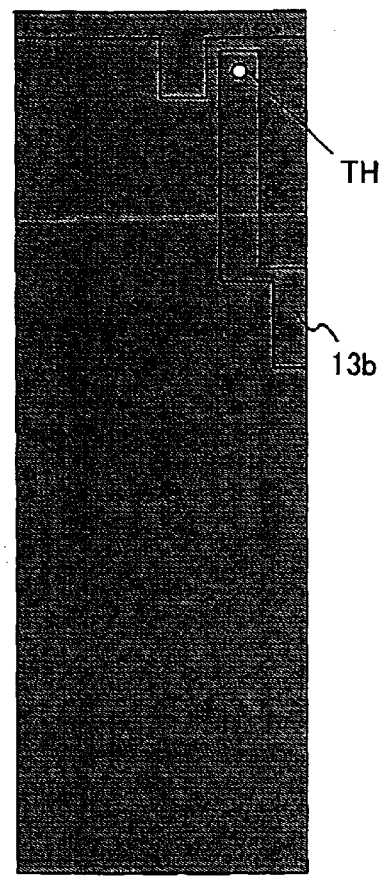

Although inferior to metals in terms of resistivity, conductive polymers may be used for the gate electrodes. In this case, the pattern formation may also be effected by low-cost methods such as printing.
Formation of Gate Insulating Film As shown in FIG. 8, the gate insulating film GIF is formed in a predetermined pattern on the bottom wiring pattern. Here, the dielectric layer 13b of the capacitor is simultaneously formed over the electrode 13a by using the same dielectric material as that of the gate insulating film GIF. The gate insulating film GIF is provided with a through hole TH for establishing connection between the gate electrode G of the address organic TFT and that of the drive organic TFT. Here, a predetermined pattern of gate insulating film having portions of different thicknesses may be formed by performing a plurality of separate formation steps such as forming a thinner film in order to exercise the facilities of the gate insulating film GIF and the capacitor dielectric layer 13b, and forming a thicker film in order to ensure insulation between the power supply line and the scan line which intersect each other.

Figure 9:
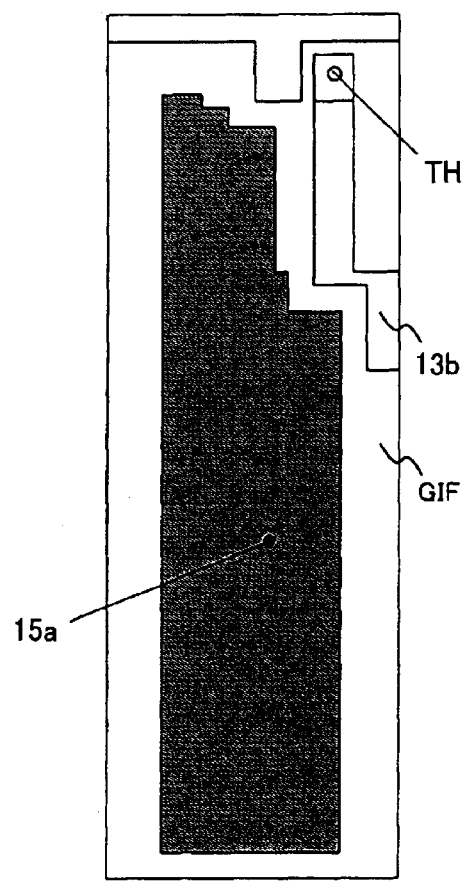

Among the available materials of the gate insulating film GIF are metal oxides, metal nitrides, metal fluorides, and other metal compounds, such as $Al_2O_3$, $SiO_2$, SiN, and SiON, and insulative polymers such as polyimide. The film formation may be effected by any method, including sputtering, EB evaporation, resistance heating evaporation, CVD, printing, and spin coating. The pattern formation may also use any method, such as photoetching, printing, and mask evaporation.
Formation of Pixel Electrode As shown in FIG. 9, the pixel electrode 15a of approximately rectangular shape, serving as the anode of the organic EL device, is formed in a predetermined pattern on the gate insulating film GIF.

When light transmittance is required, the pixel electrode 15a is formed as an extremely thin semi-transparent film made of a pure metal or an alloy, or a transparent electrode made of metal oxide or the like. For example, semi-transparent films of Au, Pd, and the like, and transparent electrodes of ITO and the like are available. When light transmittance is not required, the pixel electrode 15*a* is typically made of a pure metal or an alloy. The available materials include Al, Ag, Cu, Au, Cr, and alloys containing the same.

The film formation may be effected by any method, including sputtering, EB evaporation, resistance heating evaporation, CVD, and printing. The pattern formation may also use any method, such as photoetching, printing, and mask evaporation.

Formation of Source Electrodes and Drain Electrodes

Figure 10:
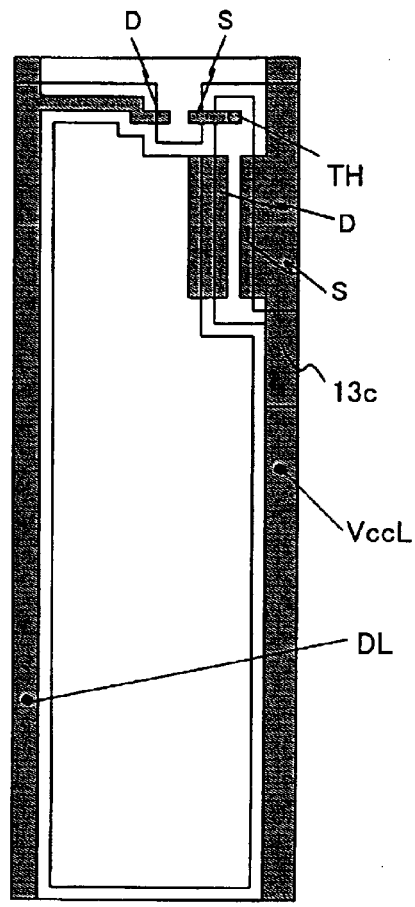

As shown in FIG. 10, the source electrodes S and drain electrodes D of the address organic TFT and drive organic TFT, and the data line DL and the power supply line VccL are formed in a predetermined wiring pattern on the pixel electrode 15*a* and the gate insulating film GIF. The data line DL and the power supply line VccL, parallel to each other across the pixel electrode 15*a*, are formed on the gate insulating film GIF so as to cross the scan line SL at right angles.

Here, part of the film of the power supply line VccL is simultaneously formed as the other electrode 13*c* of the capacitor which sandwiches the dielectric layer 13*b* with the electrode 13*a* of the capacitor. The power supply line VccL, intended for power supply, is formed larger than the other lines in width. Since the resulting capacitor 13 is located immediately below the power supply line VccL, it is possible to secure a sufficient capacitance of the capacitor 13 without interfering with the pixel electrode. In addition, the capacitor 13 is arranged on a side of the drive organic TFT 12 opposite from the address organic TFT 11. The wiring length between the drive organic TFT 12 and the address organic TFT 11 thus becomes shorter than when the capacitor 13 is arranged between the drive organic TFT 12 and the address organic TFT 11. This also promises that the area of the pixel electrode is secured to improve the charge transfer speed.

The source electrode S and the drain electrode D of the drive organic TFT in connection with the power supply line VccL are formed so as to overlap the corresponding gate electrode. The drain electrode D is connected to the pixel electrode 15*a*. The drain electrode D and the source electrode S of the address organic TFT in connection with the data line DL are formed so as to overlap the corresponding gate electrode. The source electrode S is connected to the gate electrode of the drive organic TFT via the through hole TH.

The source electrodes and the drain electrodes are preferably made of material that allows efficient carrier injection to the intended organic semiconductor and has a low resistivity. Examples of the material include Au and Pd. The data line DL and the power supply line VccL are made of the same material as that of the scan line SL.

The film formation may be effected by any method, including sputtering, EB evaporation, resistance heating evaporation, CVD, and printing. The pattern formation may also use any method, such as photoetching, printing, and mask evaporation.

Although inferior to metals in terms of resistivity, conductive polymers may be used for the source and drain electrodes. In this case, the pattern formation may also be effected by low-cost methods such as printing.

The source electrodes and drain electrodes may be made of the same material as that of the pixel electrode 15*a*, in which case the pixel electrode 15*a* and the source and drain electrodes can be formed in a single step. Depending on the materials, the foregoing predetermined wiring pattern may be formed in a plurality of separate steps.

In the present embodiment, the step of forming the pixel electrode 15*a* precedes the step of forming the source and drain electrodes. However, the steps may be performed in reverse order.

Formation of Organic Semiconductor Film

Figure 11:
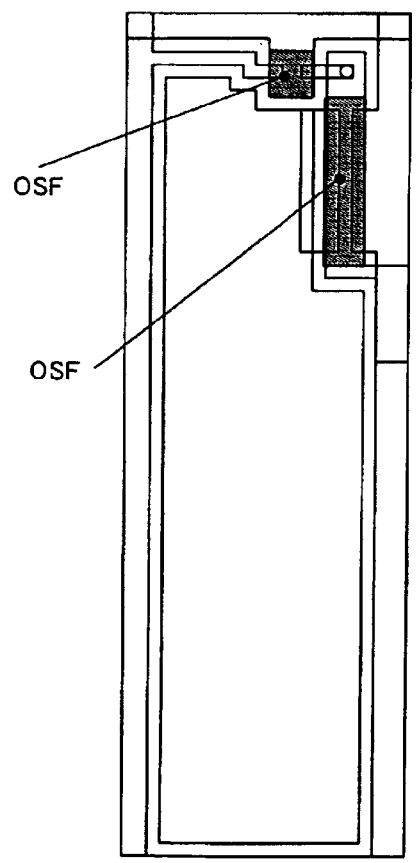

As shown in FIG. 11, the organic semiconductor film OSF is formed in a predetermined pattern so that it establishes connection with the source electrodes S, the drain electrodes D, and the gate insulating film GIF immediately above the gate electrodes of the drive organic TFT and the address organic TFT in connection with the power supply line VccL and the data line DL, respectively.

The organic semiconductor film OSF is preferably made of material having high carrier mobility, such as low molecular organic semiconductor materials and organic semiconductor polymers.

The film formation may be effected by any method, including sputtering, EB evaporation, resistance heating evaporation, CVD, printing, and spin coating.

The pattern formation may also use any method, such as photoetching, printing, and mask evaporation.

Formation of Common Insulating Film (Source-Drain Insulating Film, Pixel Insulating Film, Organic Semiconductor Protective Insulating Film)

Figure 12:
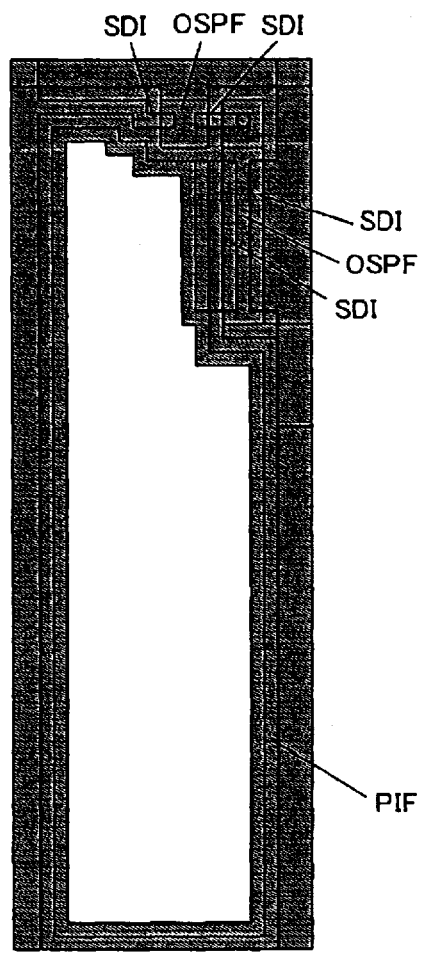

As shown in FIG. 12, a common insulating film is formed in a predetermined pattern such that it overlaps the edges of the pixel electrode 15*a* of the organic EL device 15 and exposes the pixel electrode 15*a*. The common insulating film functions as the source-drain insulating film SDI, the pixel insulating film PIF, and the organic semiconductor protective insulating film OSPF.

Among the available materials of the common insulating film are metal oxides, metal nitrides, metal fluorides, and other metal compounds, such as $Al_2O_3$ SiON, and SiON, and insulative polymers such as polyimide.

The film formation may be effected by any method, including sputtering, EB evaporation, resistance heating evaporation, CVD, printing, and spin coating. The pattern formation may also use any method, such as photoetching, printing, and mask evaporation.

Note that the underlying organic semiconductor film OSF is typically made of material that is poor in heat resistance, solvent resistance, and moisture resistance. The semiconductor film must be prevented from property deterioration in the process of forming the common insulating film which is formed on the organic semiconductor film.

Formation of Organic Material Layer

Figure 13:
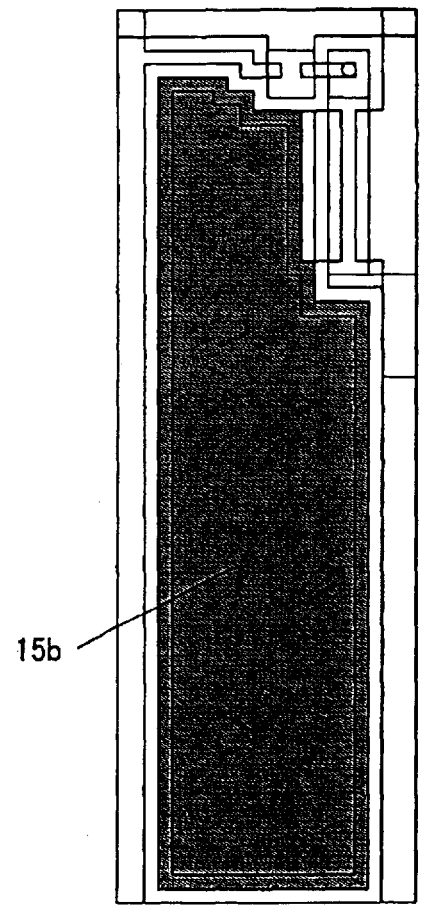

As shown in FIG. 13, the organic material layer 15*b* including at least a light-emitting layer is formed on the pixel electrode 15*a* through the opening in the common insulating film. Aside from the light-emitting layer, the organic material layer 15*b* may include a hole injecting layer, a hole-transporting layer, an electron-transporting layer, an electron injection layer, and so on.

The film formation may be effected by any method, including sputtering, EB evaporation, resistance heating evaporation, CVD, printing, and spin coating.

The pattern formation may also use any method, such as photoetching, printing, and mask evaporation.

Formation of Common Electrode

Figure 14:
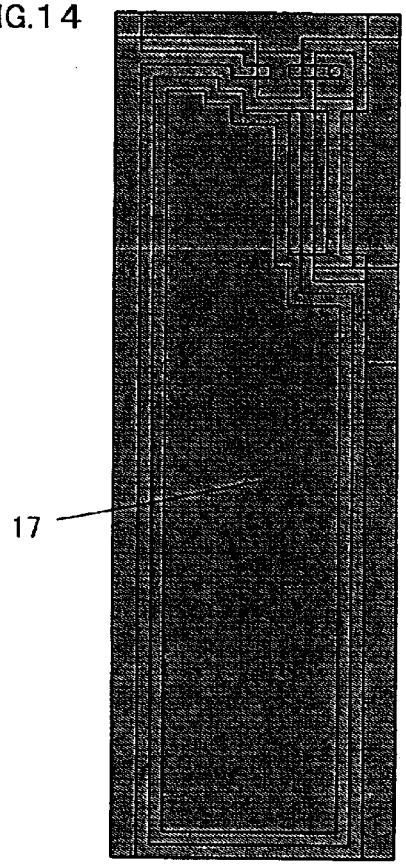

As shown in FIG. 14, the common electrode 17, i.e., the cathode of the organic EL device 15, is formed in a predetermined pattern on the organic material layer 15*b*.

The common electrode 17 is made of a pure metal or an alloy. The available materials include Al, Ag, Cu, Au, Cr, and alloys thereof.

The film formation may be effected by any method. For example, sputtering, EB evaporation, resistance heating evaporation, CVD, printing, and the like may be performed at temperatures not exceeding the glass transition temperatures of the respective organic material layers formed in the step of forming the organic material layers so as not to deteriorate any of the organic material layers.

The pattern formation may also use any method, such as photoetching, printing, and mask evaporation.

Other Embodiments

Figure 15:
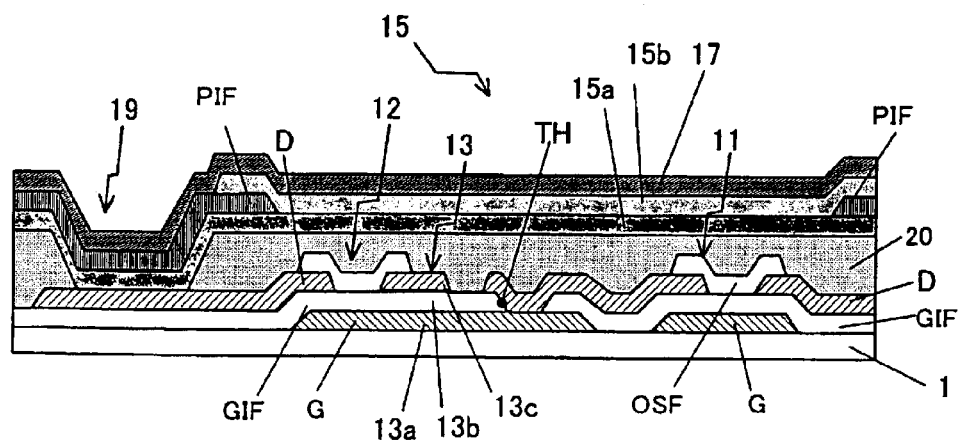
FIG. 15 is a sectional view showing the light emitting part of the display panel of the organic EL display according to another embodiment of the present invention.

As shown in FIG. 15, the organic EL device 15 may be located over the organic TFTs 11 and 12. In FIGS. 15 and 6, identical reference numerals or symbols designate the same members. Description thereof will thus be omitted. In this case, the common electrode 17 is desirably made of material having light transmittance. This structure has the advantage that the area of the organic EL device 15 can be increased for a higher opening ratio.

The address organic TFT 11 and the drive organic TFT 12 are formed before a planarizing layer 20 is formed thereover except a connecting portion 19 to the pixel electrode 15a. The planarizing layer 20 functions as both the organic semiconductor protective insulating film OSPF and the source-drain insulating film SDI. The planarizing layer 20 is intended to cover projections and depressions resulting from the organic TFTs since the presence of the projections and depressions facilitates a short circuit between the pixel electrode 15a of the organic EL device and the common electrode 17. Since the underlying organic semiconductor materials are typically poor in heat resistance, solvent resistance, and moisture resistance, the semiconductor films must be protected from property deterioration in the process of forming the planarizing layer 20.

After the formation of the planarizing layer 20, the pixel electrode 15a is formed in connection with the drive organic TFT 12. Then, the organic material layer 15b and the common electrode 17 are formed to complete the display panel of the organic EL device according to the present invention.

According to the foregoing embodiments, it is thus possible to achieve an organic EL display panel of organic TFT drive type with a practical structure. Moreover, in view of the fabrication process, the members that require heat resistance, solvent resistance, and moisture resistance during the photolithography step and the like, such as the wiring and the insulating films, are previously formed before the evaporation of the organics. This precludes damage to the organic members which are poor in heat resistance, solvent resistance, and moisture resistance during the photolithography step and the like. Besides, at least two of the necessary insulating films can be formed simultaneously for simplified steps.

In the foregoing embodiments, the organic TFTs in the light emitting parts are organic thin film transistors of so-called MIS (Metal Insulator Semiconductor) type. Nevertheless, organic thin-film transistors of SIT (Static Induction Transistor) type may be used instead of MIS type.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese patent application No. 2002-266449 which is herein incorporated by reference.

What is claimed is:

1. An organic electroluminescence display comprising a substrate and a plurality of light emitting parts formed on said substrate, each of said light emitting parts including an organic electroluminescence device and an organic thin film transistor connected to said organic electroluminescence device, said organic electroluminescence device having a pair of opposed electrodes and an organic material layer including an organic light-emitting layer laminated between said pair of electrodes, said organic thin film transistor having a source electrode and a drain electrode opposed to each other, an organic semiconductor film laminated so as to form a channel between said source electrode and said drain electrode, and a gate electrode for applying a field to said organic semiconductor film between said source electrode and said drain electrode, each of said light emitting parts further including a source-drain insulating film for avoiding a short circuit between said source electrode and said drain electrode, a protective insulating film for protecting said organic semiconductor film, and a pixel insulating film for covering an edge of either one of said electrodes of said organic electroluminescence device; and at least two out of said source-drain insulating film, said protective insulating film, and said pixel insulating film being made of the same dielectric material.

2. The organic electroluminescence device according to claim 1, comprising capacitors connected to said respective organic thin film transistors, wherein:

each of said organic thin film transistors has a gate insulating film for insulating said gate electrode from said source electrode and said drain electrode; and said gate insulating film is made of the same material as a dielectric of said capacitors.

3. The organic electroluminescence device according to claim 1, wherein:

a plurality of power supply lines, scan lines, and data lines are laid on said substrate; and said light emitting parts are arranged in a matrix, in the vicinities of intersections of said lines.

4. The organic electroluminescence device according to claim 1, wherein each of said light emitting parts includes a first organic thin film transistor connected to one of said scan lines and one of said data lines, and a second organic thin film transistor connected to one of said power supply lines and said organic electroluminescence device, said first organic thin film transistor being connected to a gate electrode of said second organic thin film transistor via a through hole made in an insulating film made of the same material as that of said gate insulating film.

5. The organic electroluminescence device according to claim 4, wherein said capacitors are arranged on a side of said first organic thin film transistors opposite from said second organic thin film transistors.

6. The organic electroluminescence device according to claim 4, wherein said capacitors are arranged immediately below said power supply lines.

7. A method of fabricating an organic electroluminescence display comprising a substrate and a plurality of light emitting parts formed on said substrate, each of said light emitting parts including an organic electroluminescence device and an organic thin film transistor connected to said organic electroluminescence device, the method comprising:

a step of forming said organic thin film transistors each having a source electrode and a drain electrode opposed to each other, an organic semiconductor film laminated so as to form a channel between said source electrode and said drain electrode, and a gate electrode for applying a field to said organic semiconductor film between said source electrode and said drain electrode;

a step of forming said organic electroluminescence devices each having a pair of opposed electrodes and an organic material layer including an organic light-emitting layer laminated between said pair of electrodes; and an insulating film forming step of forming, in each of said light emitting parts, a source-drain insulating film for avoiding a short circuit between said source electrode and said drain electrode, a protective insulating film for protecting said organic semiconductor film, and a pixel insulating film for covering an edge of either one of said electrodes of said organic electroluminescence device, wherein at least two out of said source-drain insulating film, said protective insulating film, and said pixel insulating film are made of the same dielectric material, said two being formed in an identical step.

8. The method according to claim 7, wherein, in steps performed after the organic material layer is formed, said organic semiconductor film is maintained in an environment not exceeding any of the heat resistance, solvent resistance, and moisture resistance of said organic semiconductor film.

* * * * *

UNITED STATES PATENT AND TRADEMARK OFFICE
CERTIFICATE OF CORRECTION

| | |
|---|---|
| PATENT NO. | : 7,042,163 B2 |
| APPLICATION NO. | : 10/655584 |
| DATED | : May 9, 2006 |
| INVENTOR(S) | : Kenichi Nagayama |

It is certified that error appears in the above-identified patent and that said Letters Patent is hereby corrected as shown below:

At column 10, line 19, of claim 1, please replace "each of said emitting parts further including a" with --each of said light emitting parts further including dielectric films including a--.

At column 10, line 21, of claim 1, please delete in its entirety the phrase "between said source electrode and said drain electrode".

At column 10, line 26, of claim 1, please replace "at least two out of said source drain insulating film, said" with --at least two out of said dielectric films--.

At column 10, line 27, of claim 1, please delete in its entirety the phrase "protective insulating film, and said pixel insulating film".

At column 11, line 14, of claim 7, please replace "light emitting parts, a source-drain insulating film for" with --light emitting parts, dielectric films including a source-drain insulating film for--.

At column 11, line 15, of claim 7, please replace "avoiding a short circuit between said source electrode" with --avoiding a short circuit--.

At column 11, line 16, of claim 7, please replace "and said drain electrode, a protective insulating film for" with --a protective insulating film for--.

At column 12, line 6, of claim 7, please replace wherein at last two out of said source-drain insulating" with --wherein at least two out of said dielectric films--.

UNITED STATES PATENT AND TRADEMARK OFFICE
CERTIFICATE OF CORRECTION

| | | |
|---|---|---|
| PATENT NO. | : 7,042,163 B2 | |
| APPLICATION NO. | : 10/655584 | |
| DATED | : May 9, 2006 | |
| INVENTOR(S) | : Kenichi Nagayama | |

It is certified that error appears in the above-identified patent and that said Letters Patent is hereby corrected as shown below:

At column 12, line 6, of claim 7, please delete in its entirety the phrase "film, said protective insulating film, and said pixel".

At column 12, line 8, of claim 7, please replace "insulating film are made of the same dielectric material," with --are made of the same dielectric material,--.

Signed and Sealed this

Nineteenth Day of September, 2006

JON W. DUDAS
*Director of the United States Patent and Trademark Office*